US012591134B2

(12) United States Patent
Gonzalez et al.

(10) Patent No.: US 12,591,134 B2
(45) Date of Patent: Mar. 31, 2026

(54) LENS ASSEMBLY, CAMERA MODULE HAVING A LENS ASSEMBLY FOR MOTOR VEHICLES, AND A METHOD FOR MAKING LENS ASSEMBLY

(71) Applicant: Ficosa Adas, S.L.U., Barcelona (ES)

(72) Inventors: Pau Castilla Gonzalez, Barcelona (ES); Sara Chamadoira, Barcelona (ES); Javier Caballero Arias, Barcelona (ES); Iñigo Salinas Ariz, Barcelona (ES); Enrique Carretero Chamarro, Barcelona (ES); Carlos Heras Vila, Barcelona (ES)

(73) Assignee: FICOSA ADAS, S.L.U., Barcelona (ES)

( * ) Notice: Subject to any disclaimer, the term of this patent is extended or adjusted under 35 U.S.C. 154(b) by 756 days.

(21) Appl. No.: 17/871,469

(22) Filed: Jul. 22, 2022

(65) Prior Publication Data

US 2023/0038551 A1    Feb. 9, 2023

(30) Foreign Application Priority Data

Jul. 23, 2021    (EP) ..................................... 21382678

(51) Int. Cl.
*G02B 27/00*        (2006.01)
*B29D 11/00*        (2006.01)
(Continued)

(52) U.S. Cl.
CPC .... *G02B 27/0006* (2013.01); *B29D 11/00865* (2013.01); *B60S 1/026* (2013.01); *C23C 14/086* (2013.01); *G02B 7/021* (2013.01)

(58) Field of Classification Search
CPC ................ G02B 27/0006; G02B 7/021; B29D 11/00865; B60S 1/026; C23C 14/086
See application file for complete search history.

(56) References Cited

U.S. PATENT DOCUMENTS

| | | | |
|---|---|---|---|
| 2008/0096013 A1 | 4/2008 | Nashiki et al. | |
| 2013/0092676 A1* | 4/2013 | Offermann | ........ B32B 17/10036 |
| | | | 219/203 |

(Continued)

FOREIGN PATENT DOCUMENTS

| | | |
|---|---|---|
| EP | 1626583 A1 | 2/2006 |
| EP | 3352008 A1 | 7/2018 |

(Continued)

OTHER PUBLICATIONS

European Search Report mailed Jan. 4, 2022 for European Application No. 21382678.7, 10 pgs.

*Primary Examiner* — James A Dudek
(74) *Attorney, Agent, or Firm* — Brooks Kushman P.C.

(57) ABSTRACT

The camera module has a lens assembly comprising a body and a heating element with an optically transparent coating applied to the body for heating it as electric current flows for removing water-based obstructions. The module includes a power supply for supplying electric current to the optically transparent coating through conductors, and a lens barrel (for receiving the body comprising a passageway for the conductors extending within the lens barrel towards the lens body. The method comprises applying to the lens body, high- and low-refractive index layers and an aluminium-doped zinc oxide layer.

19 Claims, 10 Drawing Sheets

(51) Int. Cl.
 B60S 1/02     (2006.01)
 C23C 14/08    (2006.01)
 G02B 7/02     (2021.01)

(56)      References Cited

U.S. PATENT DOCUMENTS

| | | | |
|---|---|---|---|
| 2014/0327349 A1* | 11/2014 | Ceremony | B01L 7/52 |
| | | | 312/348.6 |
| 2014/0362434 A1 | 12/2014 | Schmitz et al. | |
| 2018/0176431 A1 | 6/2018 | Kim et al. | |
| 2018/0210161 A1 | 7/2018 | Park et al. | |
| 2019/0391075 A1 | 12/2019 | Herrero et al. | |
| 2020/0238922 A1 | 7/2020 | Fujisaki et al. | |
| 2020/0314311 A1 | 10/2020 | Liu et al. | |
| 2021/0103120 A1 | 4/2021 | Lee | |

FOREIGN PATENT DOCUMENTS

| | | | |
|---|---|---|---|
| EP | 3373571 A1 | 9/2018 | |
| EP | 3582483 A1 | 12/2019 | |
| KR | 20100019676 A | 2/2010 | |
| WO | 2015000534 A1 | 1/2015 | |

* cited by examiner

FIG.8A
FIG.8B
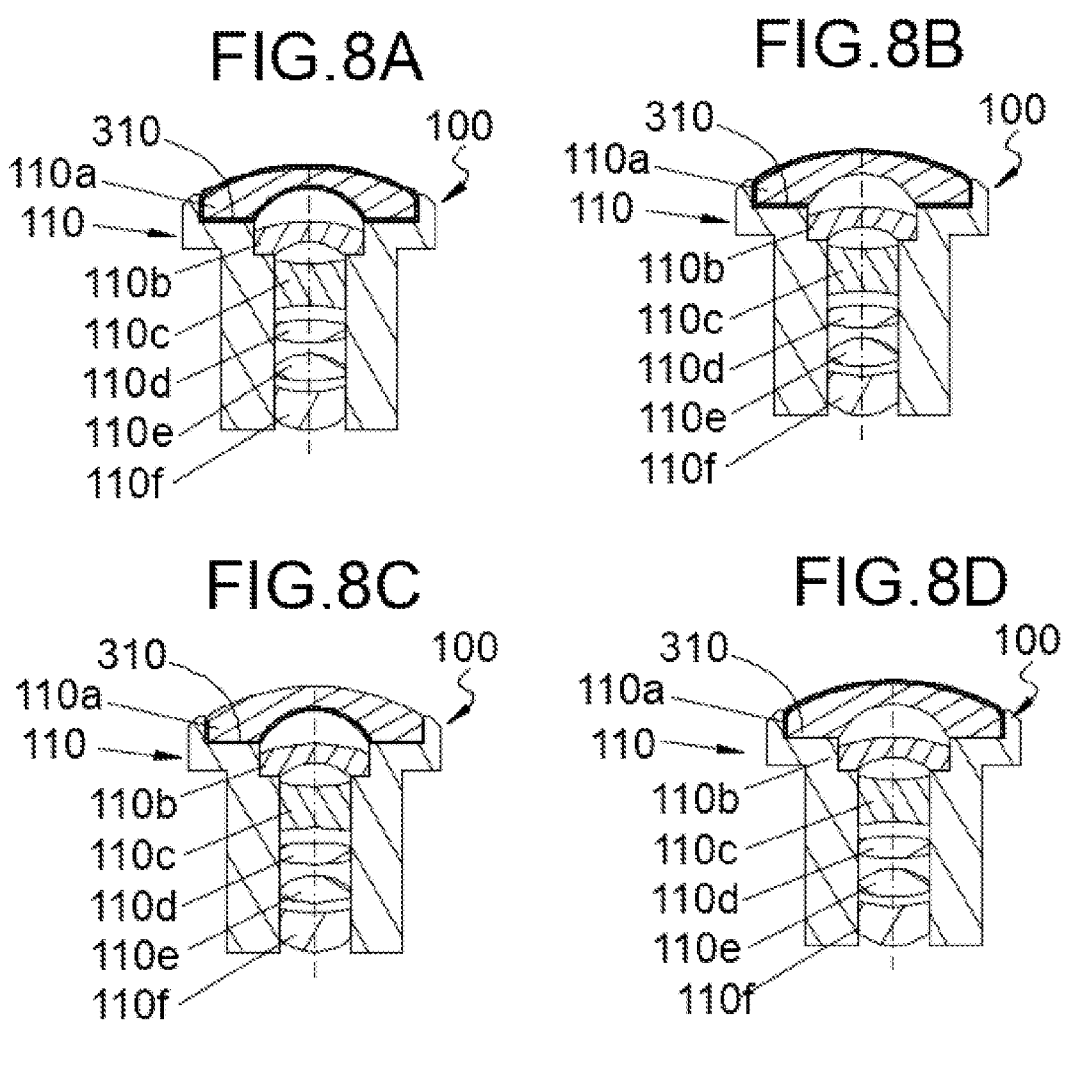
FIG.8C
FIG.8D
FIG.8E
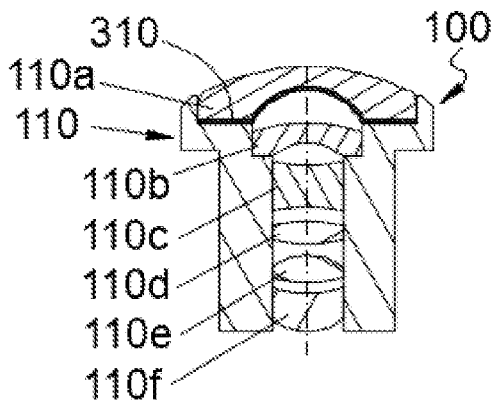

FIG. 9
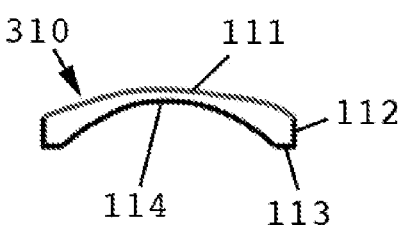
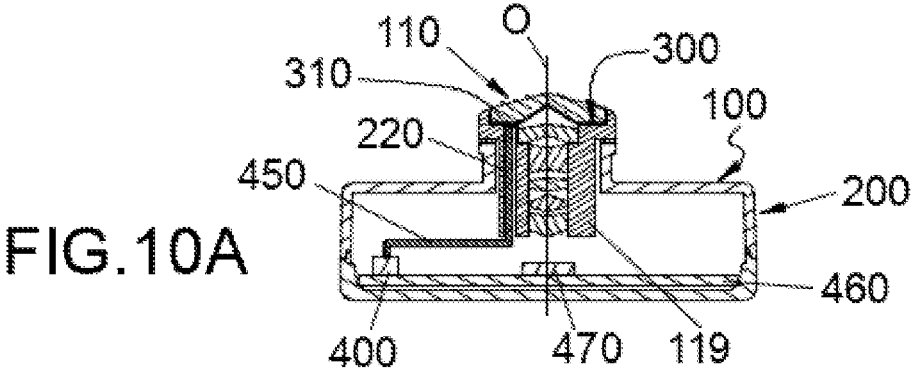
FIG.10A
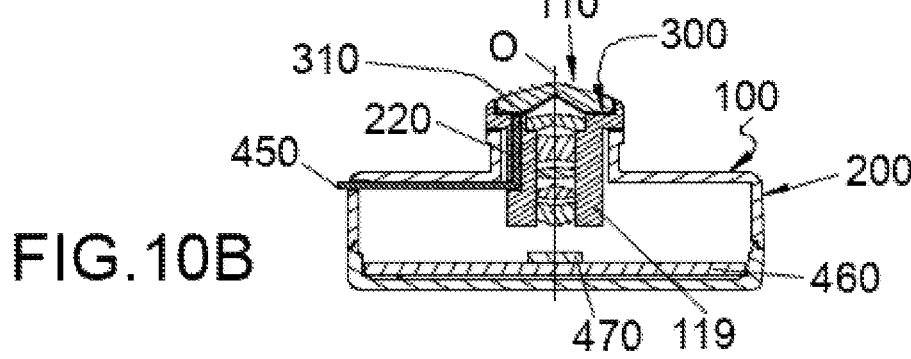
FIG.10B
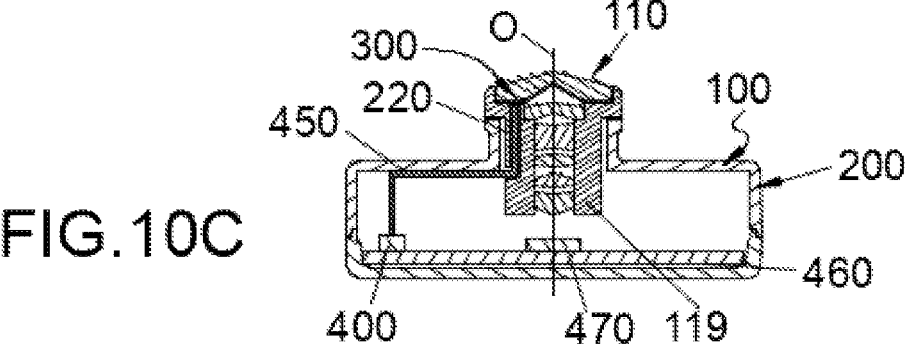
FIG.10C

LENS ASSEMBLY, CAMERA MODULE HAVING A LENS ASSEMBLY FOR MOTOR VEHICLES, AND A METHOD FOR MAKING LENS ASSEMBLY

CROSS-REFERENCE TO RELATED APPLICATIONS

This application claims priority to EP application Serial No. 21382678.7 filed Jul. 23, 2021, the disclosure of which is hereby incorporated in its entirety by reference herein.

TECHNICAL FIELD

The present disclosure generally relates to camera modules, lens assemblies for camera modules, and methods for making lens assemblies especially, but not limited, to the automotive field.

BACKGROUND

Camera modules are widely used in the automotive field for capturing images from outside a motor vehicle such as in rear view mirrors, backup cameras, front and rear view cameras, etc. Known camera modules comprise a lens assembly that includes a lens body with at least one lens element fitted to a lens housing or lens assembly holder. Such camera modules also include an image sensor or imager that is in optical communication with the lens body. The image sensor should be arranged in alignment with the lens body for proper image quality.

At least one portion of a surface of the lens body is arranged facing outwards the motor vehicle and is thus susceptible of being coated by external moisture from the air. This results in optical interference or contamination such that the image captured by the camera module is not sharp. In addition, external moisture may freeze when ambient temperature drops, such that a layer of ice may be created that adheres to the lens surface at least partially blocking the captured image.

Various attempts have been made for removing water-based obstructions that may be attached to a lens surface. For example, a heating device has been proposed to be provided in the camera module for the purpose of heating a lens surface.

EP1626583, filed in the name of the present applicant, discloses an image acquisition unit for monitoring the exterior of a vehicle comprising a heating device for providing thermal energy to a transparent element.

Camera modules comprise a barrel housing or lens assembly holder for receiving a lens assembly and a heating device for heating the lens that is provided on an outer circumferential surface of the barrel housing. The heating device is configured as a non-transparent ring that is fixed to the inner surface of the barrel housing. As a result, a gap is undesirably created between the ring of the heating device and the outer circumferential surface of the lens body, in particular, the lens barrel of the lens body. This may cause issues in camera modules. In order to obtain both high optical efficiency for good image quality and electrical conductivity for suitable lens heating effect, the gap between the heating device and the surface of the lens assembly should be as small as possible. However, reducing the gap is difficult to achieve in practice since the gap is formed due to manufacturing tolerances and assembly processes of the camera modules that cannot be avoided. In addition, if the heating device is not properly placed, the lens housing may be heated by conduction undesirably reaching and damaging electronic parts such as a printed circuit board (PCB) that is provided therein. If the PCB is overheated, buckling or bending may result causing the imager to be moved resulting in unwanted misalignment with respect to the lens body.

The present lens assembly, camera module, and method overcome the above and other deficiencies.

SUMMARY

In a first aspect of the present disclosure, a lens assembly is provided. The lens assembly comprises a lens body and a heating element. The heating element in the present lens assembly includes an optically transparent coating that comprises an optically transparent conductive layer. The optically transparent coating is applied to at least one portion of the lens body.

The optically transparent conductive layer may be a homogeneous (e.g., continuous) layer but alternatively it may be a non-homogeneous (e.g., discontinuous) layer, as required. Furthermore, the optically transparent conductive layer that forms the heating element may partially or completely cover at least one portion of a surface of the lens body such as for example a front or exterior surface thereof.

The optically transparent coating is intended for resistive heating of the at least one portion of the lens body as electric current flows there through. This allows any water-based obstructions, such as, for example, at least one of fog, condensation, snow, and ice, that may be attached to the lens body, to be efficiently removed.

As used herein, the terms coating and layer refer to a thin sheet of material applied to a surface of at least one portion of an object such as a lens or a cover provided for protecting the lens.

It may be preferred that the optically transparent conductive layer comprises at least aluminium-doped zinc oxide (AZO). Although AZO is a preferred conductive element, other suitable materials for the optically transparent conductive layer such as, for example, indium tin oxide (ITO), indium zinc oxide, and any other transparent conducting metal oxide may be used.

The optically transparent coating may further comprise at least one optically transparent back layer and at least one optically transparent front layer. The at least one optically transparent back layer is arranged between the lens body and the optically transparent conductive layer. The at least one optically transparent front layer is arranged on top of the optically transparent conductive layer. In one example, a number of optically transparent back layers may be combined with the optically transparent conductive layer and a single optically transparent front layer. Different configurations are possible for the purposes of the present disclosure.

According to an advantageous example, the optically transparent back layer is an optical antireflective or antireflection layer suitable to eliminate or to at least reduce reflections from the lens body. In particular, the optically transparent back layer may comprise at least one high-refractive index layer and at least one low-refractive index layer.

As it is known in the field of optics, the refractive index (refraction index or index of refraction) is a dimensionless value that corresponds to the measure of bending of a light ray when passing through different media, that is, a measure of how much a path of light is bent, or refracted, when entering a material. For example, a refractive index of 1.333 for water entails that light travels 1.333 times slower in water than in a vacuum. Increasing the refractive index corresponds to decreasing the speed of light in the material.

The high-refractive index layer may have a high refractive index. Further, the high-refractive index layer may preferably comprise a non-conductive and optically transparent metal material or an optically transparent metal oxide with low electrical conductivity such as titanium oxide ($TiO_x$). The low-refractive index layer may have a low refractive index. Further, the low-refractive index layer may preferably comprise an optically transparent dielectric material such as silica ($SiO_2$). Other materials for the high-refractive index layer and the low-refractive index layer are possible.

Those skilled in the art will readily recognize the meaning of high-refractive index and low-refractive index in the field of optics. Thus, within the meaning of the present disclosure, high-refractive index corresponds to a refractive index above 1.65, more preferably, between 1.7 and 2.9, and still more preferably, between 2.0 and 2.4. Low-refractive index corresponds to a refractive index below 1.65, preferably below 1.60, more preferably, between 1.3 and 1.65, and even more preferably, between 1.4 and 1.5.

For example, at 550 nm light wavelength the refractive index for $SiO_2$ is 1.44-1.52, the refractive index for $TiO_x$ is 2.2-2.5, and the refractive index for AZO is 1.8-1.86.

In general, the optically transparent back layer of the lens assembly includes a number, preferably in pairs, of alternatingly disposed low- and high-refractive index layers to form the optically transparent back layer resulting in an efficient anti-reflective multi-layer coating.

For a 10-1000 nm thick optically transparent coating, the following thicknesses are preferred for the different layers.

The electrically conductive layer, for example AZO, is preferred to be 10-900 nm thick, preferably, 20-600, more preferably, 20-350, and even more preferably, 70-300 nm. The low-refractive index layer, for example $SiO_2$, is preferred to be 9-90 nm thick, preferably, 20-40 nm. The high-refractive index layer, for example $TiO_x$, is preferred to be 2-30 nm thick, preferably, 5-30 nm thick, more preferably, 5-15 nm thick, still more preferably, 5-10 nm. The optically transparent front layer, for example, $SiO_2$, is preferred 10-200 nm thick, preferably, 50-150 nm.

The above thicknesses may be provided either alone or in combination. The above thicknesses have been proven to be advantageous for making an optically transparent coating having both conductive and anti-reflective characteristics in the visible range of 400 nm-750 nm.

It may be advantageous if one or more of the layers that make up the optically transparent coating is applied on the lens body by physical vapor deposition (PVD) as known in the art for producing thin films and coatings. That is, the optically transparent conductive layer may be applied by physical vapor deposition (PVD) and also the other layers such as the high-refractive index layer, the low-refractive index layer and/or the at least one optically transparent front layer may be applied by physical vapor deposition (PVD). An area of the lens body, particularly a front surface thereof, to be covered may be, for example, 0.5-5 cm$^2$, preferably, 2 cm$^2$.

The lens body may comprise a front surface, a back surface, and a side surface. In use, the front surface is arranged facing the back surface and the side surface abuts the front surface and the back surface. The side surface may further include at least a portion which is substantially parallel to the optical axis. The optical axis may be defined as a theoretical line that passes through the center of the lens and the image sensor. The side surface of the lens body may include lateral surfaces where the optical axis does not pass through. The front surface and the back surface of the lens body are the surfaces which the optical axis passes through.

The optically transparent coating may be applied to at least one portion of one or more of a front surface, a back surface, and a side surface of the lens body.

In one preferred example, the optically transparent coating is arranged on a front surface and/or a back surface of the lens body and, in general, on at least one surface of the lens body where the optical axis passes through.

Preferably, the optically transparent coating is arranged on two surfaces of the lens body and more preferably the optically transparent coating is arranged on two mutually adjacent surfaces of the lens body. More preferably, the optically transparent coating is arranged both on at least one portion of the surface of the lens body where the lens optical axis passes through and on at least one portion of the surface of the lens body where the lens optical axis does not pass there through. For example, it may be the case where the optically transparent coating is arranged both on at least one portion of a front surface and at least on one portion of a side surface of the lens body.

Location of the lens body where the optically transparent coating is applied may depend on the radius of curvature of the outer surface of lens body. In cases where a lens body has a large radius of curvature, i.e., a nearly flat lens body, the optically transparent coating may be applied seamlessly to a front surface thereof. As the curvature of the front surface of the lens body increases, the optically transparent coating may be preferred to be applied to any location out of the front surface of the body lens such as the back surface or the side surface of the lens body.

Preferably, the optically transparent may be applied to at least one of: (i) a portion of the front surface and a portion of the side surface of the lens body; or (ii) a portion of the back surface and a portion of the side surface of the lens body.

The lens body may comprise a plurality of lens elements and a lens barrel. The plurality of lens elements, in use, are aligned to guide light from one lens element to another so as to reach the image sensor or imager when the lens assembly is properly mounted in the camera module. Therefore, the lens body may include two or more lens elements constructed as an array of optically transparent pieces, such as glass pieces or plastic pieces, arranged in a specific order, to allow light to pass from one end to the other and ultimately into the camera module housing where the image sensor is arranged. In a preferred example, the lens body may include four, five or six lens elements. Different number of lens elements are of course possible.

The plurality of lens elements is housed within the lens barrel. The lens barrel may be a tube shaped encasing the plurality of lens. Therefore, the lens barrel may be part of the lens body and may be manufactured from a wide variety of materials ranging from plastic to metals.

The plurality of lens elements may include at least one lens element having the configuration described above. That is, each lens element of the plurality of lens elements may comprise a front surface, a back surface, and a side surface. The front surface of the lens element may be arranged facing the back surface. A first lens element of the plurality of lens elements may be the outermost lens element of a vehicle where it is fitted. The first element may comprise an outer surface which may be the front surface that may be at least partially surrounded by the exterior environment of the camera module. In use, when lens assembly is attached to the camera module, the outer surface of the first element may be the surface of the lens assembly that is located furthest from the image sensor. The back surface may, in turn, comprise a first part which may be substantially perpendicular to the optical axis and a second part which may be a curved part. Further, the side surface may abut the front surface and the back surface. The side surface of the lens body may include a plurality of lateral surfaces where the optical axis may not pass through. Furthermore, at least a portion of the side surface may be substantially parallel to the optical axis.

The second part of the back surface and the front surface of the lens element are the surfaces which the lens optical axis passes through. The side surface of the lens element may include lateral surfaces where the optical axis does not pass through. The side surface may include at least one lateral surface that may be substantially parallel to the optical axis.

The first part of the back surface may include a surface arranged at least substantially perpendicular to the optical axis with the optical axis not passing there through.

The optically transparent coating may be applied to at least one portion of one or more of the front surface, the side surface, and the back surface of the first lens element of the body lens. Preferably, the optically transparent coating may be applied to at least one portion of two or more of the following surfaces of the first lens element: front surface, side surface, and back surface. It has been found advantageous to apply the optical transparent coating to at least two surfaces and more preferably to at least two adjacent surfaces of the lens element since the time required for heating the front surface is reduced and thus the time to remove any water-based obstructions that may be attached to the front surface is advantageously decreased.

As stated above, it is preferred that the optically transparent coating is applied to at least one of:

(i) a portion of the front surface and a portion of the side surface of the first lens element; or (ii) a portion of the first part of the back surface and a portion of the second part of the back surface of the first lens element.

More preferably, the optically transparent coating may be applied to at least:

(a) a portion of the front surface, a portion of the side surface, and a portion of the first part of the back surface of the first lens element; or (b) a portion of the first part of the back surface, a portion of the second part of the back surface, and a portion of the side surface of the first lens element.

Preferably, the heating element further includes conductors for the supply of an electric current to the optically transparent conductive layer for resistive heating of at least one portion the lens body. The conductors are arranged electrically connecting a power supply to the transparent conductive coating for feeding electrical current thereto. Suitable conductors may be aluminium or copper electric cables, or a layer made of conductive material such as ITO or AZO. For direct current (DC) devices, for example, two conductors are provided to close the circuit.

Preferably, the heating element may further include an attaching mechanism for attaching the conductors to the optically transparent coating such that the conductors may be electrically connected to the optically transparent conductive layer.

More preferably, the attaching mechanism may be arranged on the first part of the back surface and/or the lateral surface of the first lens element.

In some cases, the optically transparent coating may not be applied directly to the lens body but to an intermediate part. For example, a cover glass may be provided onto the lens body in which case the transparent conductive coating is applied to the cover and thus not directly to the lens. In this case, the area of the lens body to be covered by the transparent conductive coating may vary. Thus, the optically transparent coating may be applied to the cover, if provided, or to the lens body, if no cover is provided. In the latter case, both the cover and the lens body may be referred herein to as optical element.

A camera module for motor vehicles is also described herein. The camera module comprises a housing defining an inner space therein, an optically transparent exterior optical element, an optically transparent interior optical element, a heating element, and an electronics carrier including an image sensor. The housing further includes a barrel housing. The camera module further comprises a lens assembly including a lens body, and a heating element. The lens body may be part of at least one of the exterior and interior optical elements.

The camera module may further include a cover as stated above for covering the above-mentioned lens assembly. The cover may be made of plastics, glass, or any other suitable material. If the camera module includes a cover, the cover corresponds to said exterior optical element and the lens body corresponds to said interior optical element. If the camera module does not include a cover, the first lens element of the lens body corresponds to said exterior optical element and the second lens element of the lens body corresponds to the interior optical element.

The camera module may include a power supply for the heating element or the heating element may be supplied with power from an outer power supply.

The camera module housing may comprise a first housing part, a second housing part and a joining mechanism for joining the first and second housing parts together so as to define a first inner space. Such a first inner space is suitable for holding electronics components such as an electronics carrier that may comprise an image sensor or imager therein. The first housing part may be a front housing, wherein the second housing part may be a back housing.

The barrel housing is configured for at least partially receiving the lens assembly. The lens assembly is at least partially inserted in and attached to the barrel housing by threading, adhesive such as glue, or by any other suitable attaching mechanism. The inner walls of the barrel housing may define a second inner space. The barrel housing may be part of or attached to the front housing. The barrel housing extends longitudinally from a first end to a second end. The barrel housing comprises a bottom surface disposed at or near the second end, a top surface disposed at or near the first end which defines an opening, and one or more sidewalls including an inner surface. A space is formed in an interior of the barrel housing. The lens assembly is arranged, at least partially, in the space formed in the interior of the barrel housing referred hereinafter as to the above mentioned second inner space.

Preferably, the barrel housing may be cylindrical or substantially cylindrical particularly adapted to at least partially receive the lens assembly. The barrel housing may comprise a top side which defines an opening wherein, in use, the lens assembly is housed by the housing having one or more lens elements of the lens body housed by the walls of the cylindrical barrel. Preferably, the lateral surface and/or the rear surface and/or the back surface of the lens body, in use, is/are arranged in the second inner space. More preferably, the lateral surface and/or the back surface of the first lens element, in use, is/are arranged in the second inner space.

The camera module also comprises an image sensor for receiving light which passes through the lens elements of the lens body. The image sensor is coupled to the electronics carrier located in the first inner space. The image sensor is configured to produce an electronic signal based on the received light.

The heating element includes an optically transparent coating that comprises an electrically conductive layer, or optically transparent conductive layer, having at least some of the features described above. Said optically transparent conductive layer is applied to at least one portion of the lens body for resistive heating thereof as electric current flows through the optically transparent conductive layer for removing any water-based obstructions that may be attached to the lens body.

The power supply may be selected for supplying a suitable voltage to the coating of 6-36 Volts (V), more preferably, 12-24 V and still more preferably 12 V. The power supply may be part of or be connected to an electronics carrier. The electronics carrier, in turn, may comprise one or more printed circuit board (PCB). In case where the electronics carrier comprises two or more printed circuit boards, the power supply may be arranged on the same printed circuit board where the image sensor is coupled or, alternatively, on other printed circuit boards. Alternatively, the power supply may be arranged outside the camera housing. If the power supply is arranged outside the camera housing, it may be preferably part of or be connected to an electronic control unit (ECU) of a camera monitoring system (CMS) or digital rear-view mirror.

The lens assembly may further comprise attaching mechanism for attaching the above-mentioned conductors to the optically transparent coating while electrically connecting the conductors to the optically transparent conductive layer. Preferably, the heating element of the lens assembly may comprise two or more conductors and at least one attaching mechanism for attaching, preferably an end, of each conductor to the optically transparent coating and electrically connecting the conductors to the optically transparent conductive layer such that an electric current may flow through at least one layer of the optically transparent coating.

The attaching mechanism may be an adhesive, preferably, an electrically conductive adhesive such as a fluid adhesive comprising a polymer and metallic particles. More preferably, the adhesive may be an epoxy-based adhesive and metallic micro and/or nanoparticles. Therefore, the conductor may be attached to the optically transparent coating with an adhesive joint such as a glue. When a fluid adhesive is used, the adhesive is in a first pre-curing state before it is applied in which it is liquid, and then the adhesive is in a second curing state once it has been applied in which it is no longer liquid. This results in better mechanical and electrical bonding features being achieved than in conventional prior art devices where attaching mechanism are used based on welding or screws.

At least one passageway is formed within the housing of the camera module, in particular, the front housing of the camera module. More in particular, the at least one passageway at least may partially pass through the barrel housing. The passageway is configured to receive the conductor for electrically connecting the power supply and the optically transparent conductive layer. The passageway is advantageously arranged extending between inner and outer walls of the barrel housing towards the lens body. In use, the conductors run through the passageway without affecting the image captured from the lens assembly to an image sensor or imager provided in the camera module.

In a second aspect of the present disclosure, a method for making a lens assembly is provided. The lens assembly comprises a lens body and a heating element, as described above. The method comprises applying, onto at least one portion of one or more of a front surface, a back surface, side surfaces, and rear surfaces of the lens body: at least one high-refractive index layer, at least one low-refractive index layer onto the high-refractive index layer, and at least one optically transparent conductive layer, facing outwards a motor vehicle, wherein said transparent conductor layer may comprise aluminium-doped zinc oxide, onto the low-refractive index layer. Further, the method further comprises applying an optically transparent front layer comprising a low-refractive index material onto the transparent conductor layer. Furthermore, the optically transparent coating is applied on the lens body by physical vapor deposition (PVD).

The camera module is assembled by at least partially inserting the lens assembly, with the optically transparent coating already applied thereon, into the lens housing and accurately moving the lens body until correct alignment with the image sensor is achieved. A calibration process may be preferably performed upon fitting of the lens assembly into the lens housing. The image sensor remains coupled to the printed circuit board (PCB) with a suitable optical communication in alignment with the lens assembly such that an image exterior of the vehicle is properly captured.

The camera module having the lens assembly with the optically transparent coating described above does not interfere on the optical performance of the camera both when it is heating the lens and when it is not.

BRIEF DESCRIPTION OF THE DRAWINGS

Non-limiting examples of a camera module will be described in the following, with reference to the appended drawings, in which:

FIGS. 8A-E are cross-sectional views of a lens body showing different examples of surfaces of the lens body where the optically transparent coating is applied;

FIG. 9 is a diagrammatic detail view depicting surfaces of the lens body to which the optically transparent coating may be applied according to the examples in FIGS. 8A-E;

FIGS. 10A-C are cross-sectional views of the present camera module showing different arrangements of the passageway for conductors;

DETAILED DESCRIPTION

Figure 1:
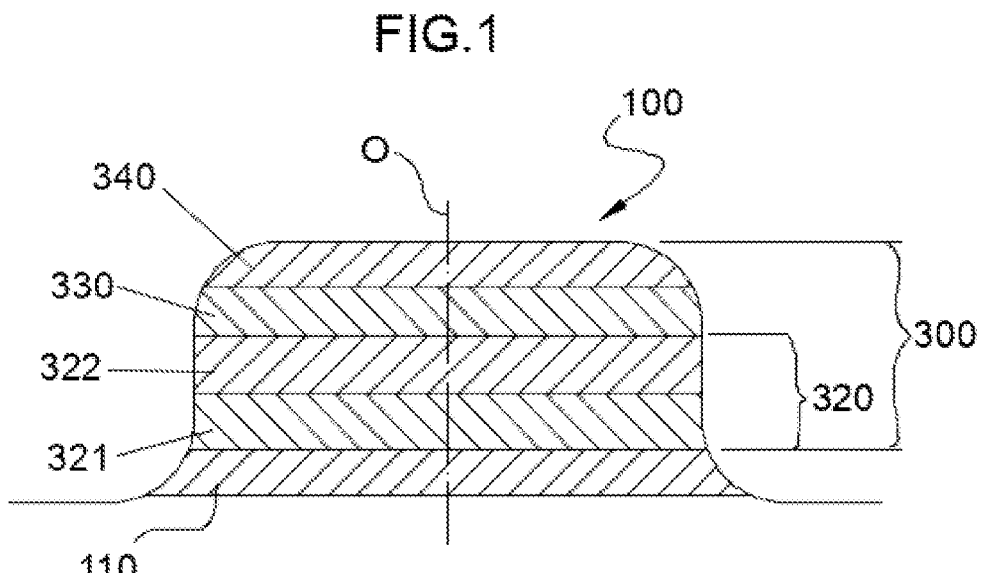
FIG. 1 is a cross-sectional detail view of the optically transparent coating on a portion of an optical element.
Figure 2:
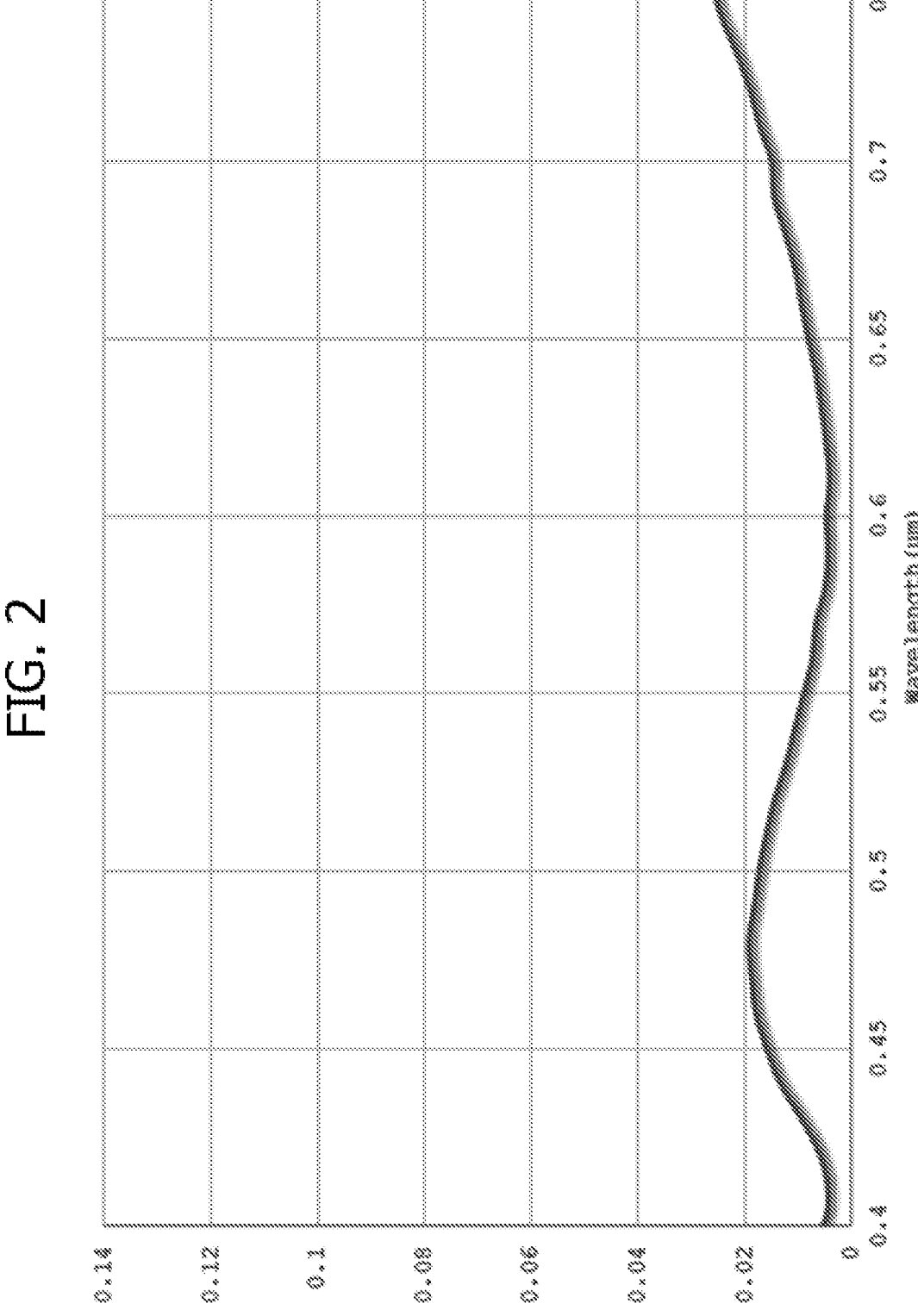
FIGS. 2-7 are graphs showing a normalized reflectance in different examples of optically transparent coatings having different layer thicknesses versus different wavelengths of visible light.
Figure 3:
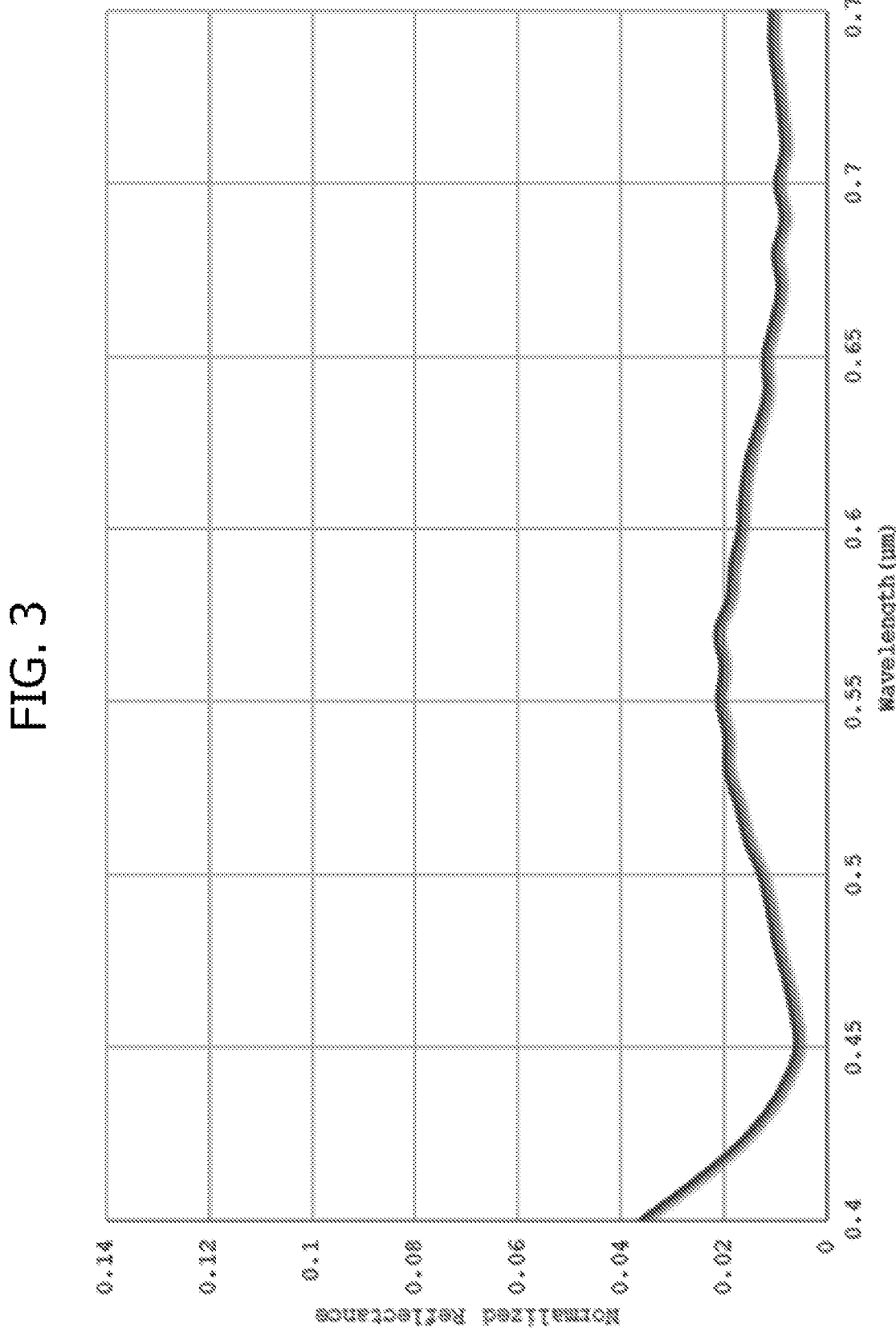
Figure 4:
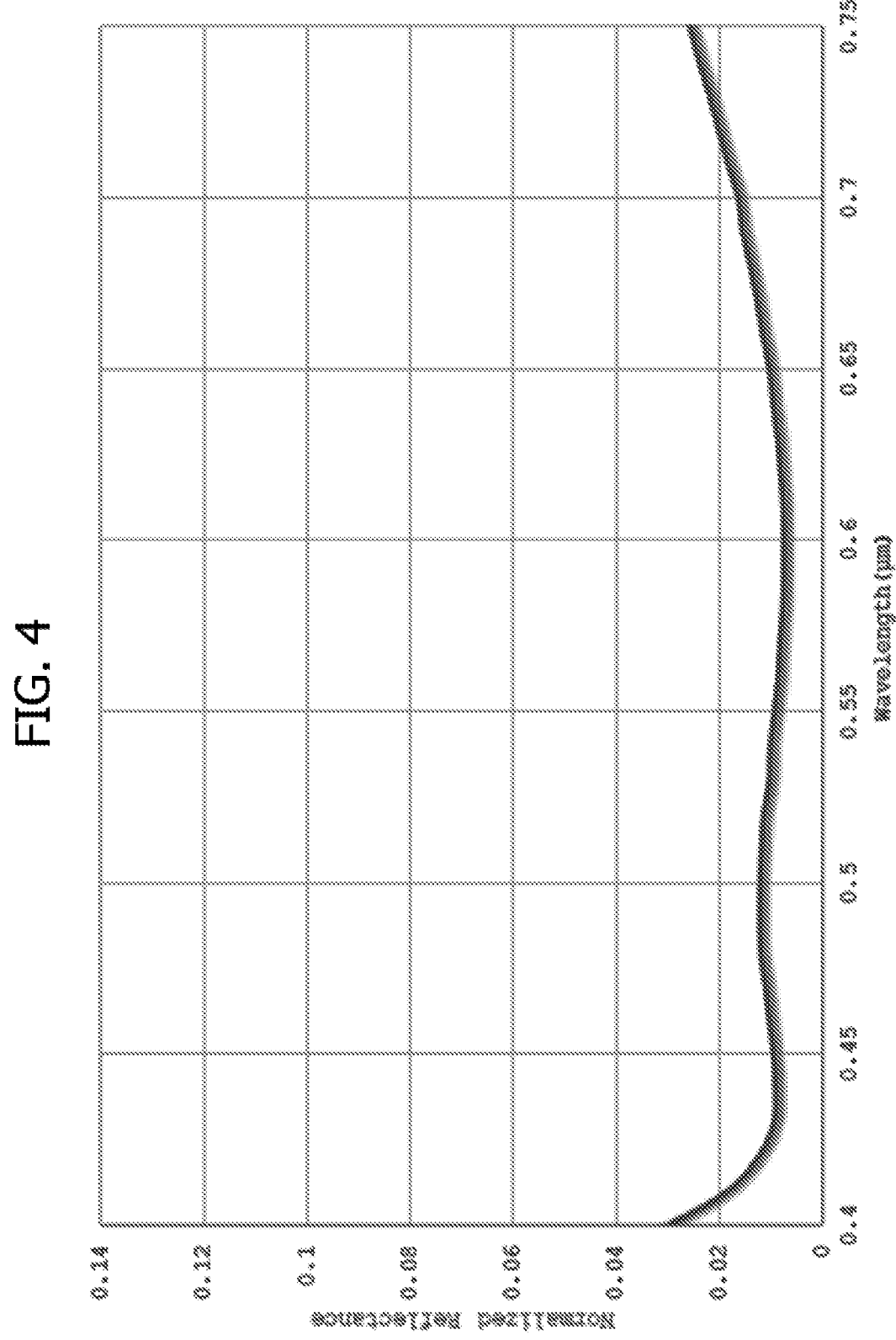
Figure 5:
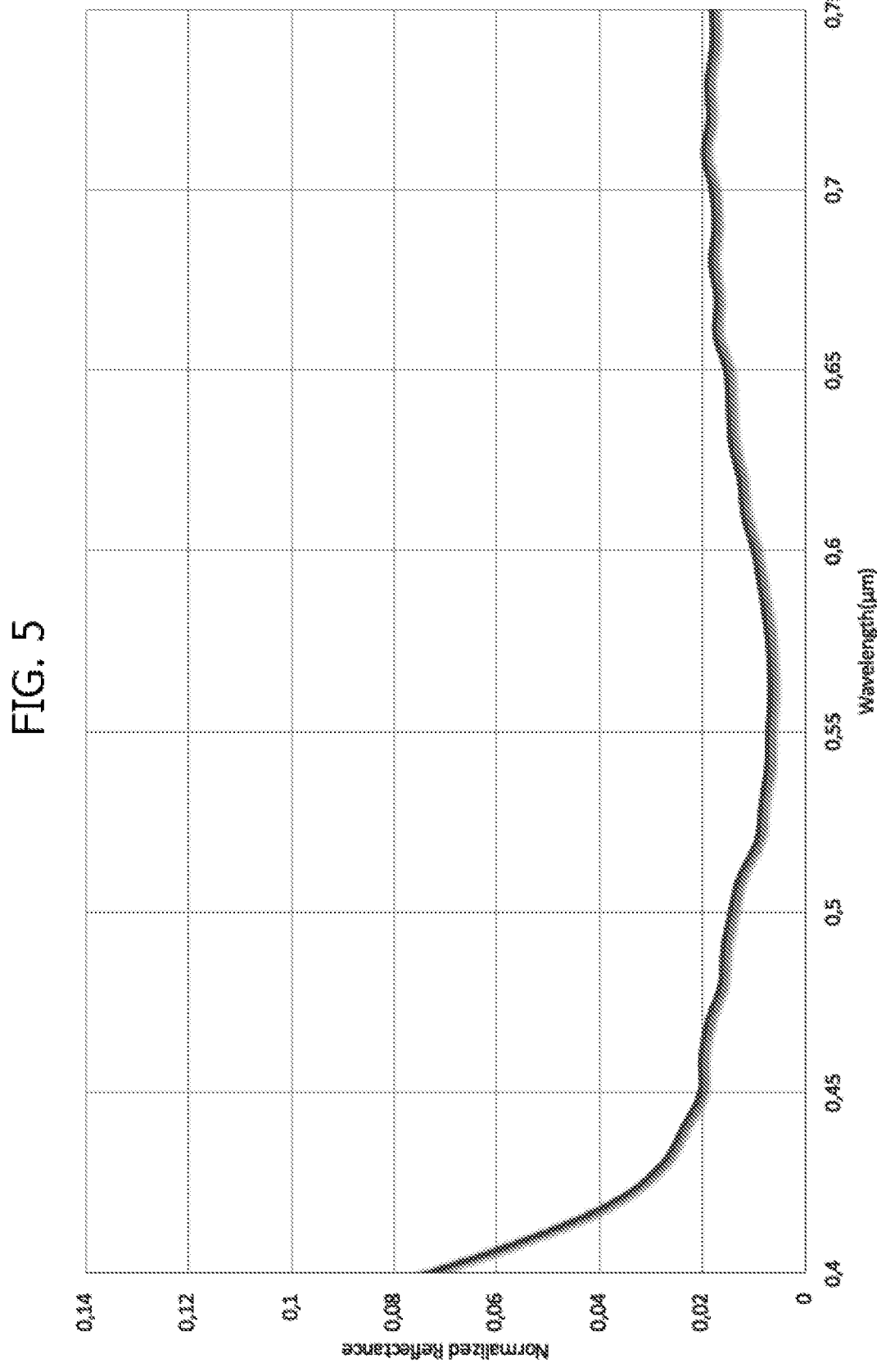
Figure 6:
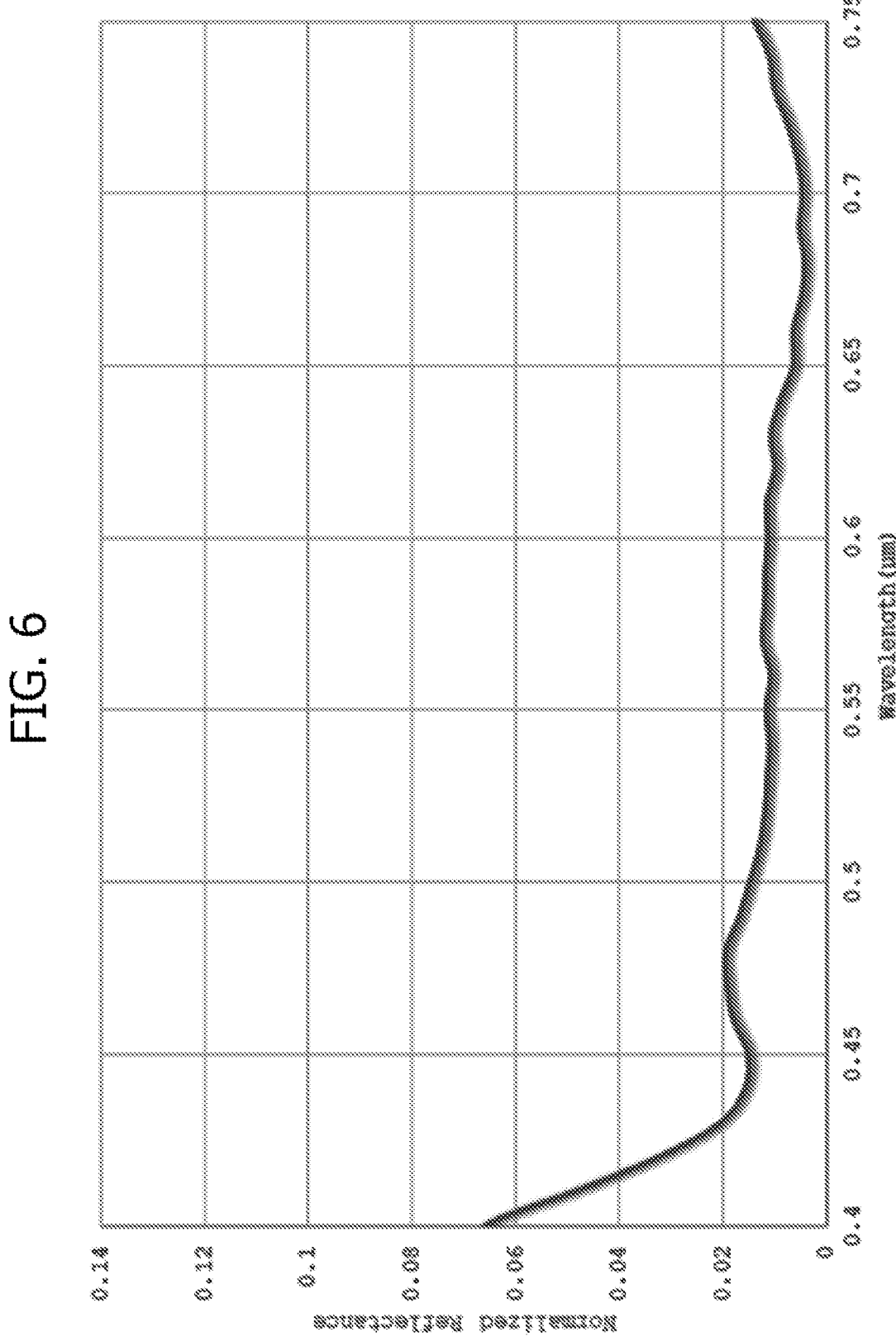
Figure 7:
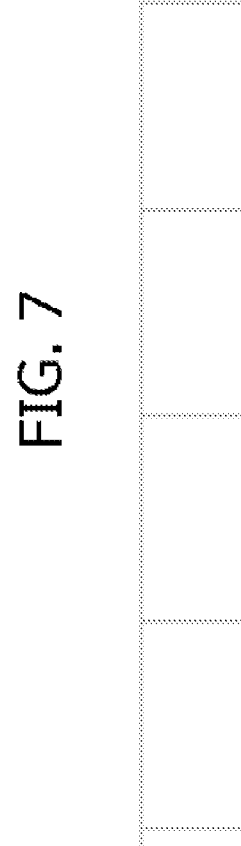

One example of a camera module 200 is diagrammatically illustrated in the non-limiting example shown in the FIGS. 10A-C, 11A-B and 12.

The camera module 200 shown may be fitted for example to a rear-view mirror for capturing images from outside a motor vehicle. Other applications of course are not ruled out such as surrounding view systems, back-up cameras for parking, or front and rear-view cameras.

The camera module 200 comprises a lens assembly 100 that includes a lens body 110 and an image sensor or imager 470. The image sensor 470 is connected on an electronics carrier, in particular, on a top face of a printed circuit board (PCB) 460. The image sensor 470 is in optical communication and arranged in alignment with the lens body 110 along an optical axis O of the lens assembly 100 as shown in FIGS. 10A-C, 11A-B and 12.

The lens assembly 100 further comprises a heating element 300 for heating a portion of the lens body 110 as electric current flows there through as it will explained in detail below.

As shown in FIG. 1, the heating element 300 includes an optically transparent coating 310. The optically transparent coating 310 may be of a homogeneous and/or continuous or non-homogeneous and/or discontinuous nature depending on optical and heating requirements. The optically transparent coating 310 further comprises an optically transparent conductive layer 330 which may be of a homogeneous and/or continuous or non-homogeneous and/or discontinuous nature depending on optical and heating requirements.

The optically transparent coating 310 includes an optically transparent layer 320 directly applied to a front surface 111 of the lens body 110. The optically transparent back layer 320 is suitable to eliminate or to at least reduce reflections from said front surface 111 of the lens body 110 due to heating action of current flowing there through.

Continuing with reference to FIG. 1, the optically transparent conductive layer 330 of the optically transparent coating 310 comprises at least aluminium-doped zinc oxide (AZO). If the optically transparent coating 310 does not include the above mentioned optically transparent back layer 320, then the optically transparent conductive layer 330 is directly applied to the lens body 110.

The optically transparent coating 310, configured as above as shown in FIG. 1, allows resistive heating of a portion of the lens body 110 as an electric current flows therethrough. This allows any water-based obstructions such as, for example, at least one of fog, condensation, snow, and ice, that may be attached to the lens body 110 to be efficiently removed without affecting an optical performance of the camera module 200.

The thickness of the transparent conductive AZO layer 330 has a significant impact on the Joule effect for efficiently heating of the lens body 110. The thickness of the AZO layer 330 of the optically transparent coating 310 is large enough for a low electrical resistance and short heating time of the lens body 110. On the other hand, the thickness of the transparent conductive AZO layer 330 is small enough for low reflectance of the lens body 110 for good image quality and safety.

Continuing with FIG. 1, the optically transparent back layer 320 in turn comprises a high-refractive index layer 321 and a low-refractive index layer 322 that is directly applied to the front surface 111 of the first lens element 110a. The transparent conductive AZO layer 330 is directly applied to said low-refractive index layer 322.

The high-refractive index layer 321 has a refractive index of above 1.65. The high-refractive index layer 321 is preferably between 1.7 and 2.9, and still more preferably, between 2.0 and 2.4. The high-refractive index layer 321 is formed of any metal oxide which, according to the example described above, is titanium oxide, TiOx.

As also shown in FIG. 1, the low-refractive index layer 322 is formed of silica, SiO2, with a refractive index of below 1.65. The low-refractive index layer 322 is preferably below 1.60, and still more preferably, between 1.3 and 1.65, and even more preferably, between 1.4 and 1.5. The low-refractive index layer 322 is directly applied onto the high-refractive index layer 321.

One or more of the high- and low-refractive index layers 321, 322 of the optically transparent back layer 320 and the optically transparent conductive layer 330 that make up the optically transparent coating 310 are applied on the lens body by physical vapor deposition (PVD).

Referring to FIGS. 8A-E, the lens body 110 comprises a plurality of lens elements 110a, 110b, 110c, 110d, 110e, 110f and a lens barrel 119. The plurality of lens elements 110a, 110b, 110c, 110d, 110e, 110f are aligned along optical axis O to guide light from one lens element to another so as to reach the image sensor 470. Said plurality of lens elements 110a, 110b, 110c, 110d, 110e, 110f are housed within the lens barrel 119. The lens barrel 119 is a tube-shaped member encasing therein the plurality of lens elements 110a, 110b, 110c, 110d, 110e, 110f.

Reference will be made hereinbelow to lens body 110 and lens elements 110a, 110b, 110c, 110d, 110e, 110f. to refer to the same elements of the lens assembly 100.

As shown in FIG. 9 of the drawings, a first lens element 110a has a back surface comprising a first part 113 which is flat and substantially perpendicular to the optical axis O and a second part 114 which is convex and curves outwards, away from the imager 470 shown in FIGS. 10A-C, 11A-B and 12. The lens element 110a has side surfaces 112 extending into the front surface 111 and the back surface 113, 114. The optical axis O does not pass through the side surfaces 112 of the first lens element 110a. The side surfaces 112 of the first lens element 110a may include a plurality of lateral surfaces where the optical axis may not pass through (not shown).

The second part 114 of the back surface and the front surface 111 of the first lens element 110a are surfaces which the lens optical axis O passes through. The side surfaces 112 of the first lens element 110a include at least one lateral surface that is substantially parallel to the optical axis O.

The first part 113 of the back surface of the first lens element 110a may include a surface arranged at least substantially perpendicular to the optical axis O with the optical axis O not passing there through.

As shown in FIGS. 8A-E of the drawings, the optically transparent coating 310 covers the front or exterior surface 111 of the lens body 110 corresponding, in the non-limiting example shown, to a surface area of the lens body 110 of 2 cm². However, other values for the surface area of the lens body 110 to be covered by the optically transparent coating 310 may be possible within a preferred range of 0.5-10 cm².

In one example, the optically transparent coating 310 may completely or partially cover the front or exterior surface 111 of the lens body 110 and/or other different portions thereof such as the back surface 114, the side surface 112, the back surface 113, and the back surface 114 of the lens body 110 shown in FIG. 9 of the drawings. In a further example, the optically transparent coating 310 may completely or partially cover a protective external cover 150 that will be explained below with reference to FIG. 11A of the drawings.

Reference is now made to FIGS. 8A-E of the drawings.

In the example shown in FIG. 8A, the optically transparent coating 310 completely or partially covers the front or exterior surface 111 of the lens body 110, the back surface 113, 114, and also the side surfaces 112 of the lens body 110.

ing burns if someone touches the camera when the vehicle is stopped and damages to the lens. A good balance between light transmission (low reflectance), heating speed, and safety is provided.

TABLE 1

| Layer material | Example 1 thickness (nm) | Example 2 thickness (nm) | Example 3 thickness (nm) | Example 4 thickness (nm) | Example 5 thickness (nm) | Example 6 thickness (nm) | Example 7 thickness (nm) | Example 8 thickness (nm) |
|---|---|---|---|---|---|---|---|---|
| Layer 321 ($TiO_x$) | 6 | 10 | 7 | 7 | 9 | 8 | 8 | 7 |
| Layer 322 ($SiO_2$) | 30 | 23 | 31 | 31 | 31 | 39 | 35 | 35 |
| Layer 330 (AZO) | 76 | 75 | 137 | 127 | 76 | 167 | 288 | 133 |
| Front Layer 340 ($SiO_2$) | 90 | 86 | 88 | 84 | 86 | 97 | 91 | 89 |

In the example shown in FIG. 8B of the drawings, the optically transparent coating 310 completely or partially covers the front or exterior surface 111 of the lens body 110, the side surfaces 112 of the lens body 110, and also the back surface 113 of the lens body 110. In the example shown in FIG. 8C of the drawings, the optically transparent coating 310 completely or partially covers the back surface 113, the back surface 114 of the lens body 110, and also the side surfaces 112 of the lens body 110.

In the example shown in FIG. 8D, the optically transparent coating 310 completely or partially covers the front or exterior surface 111 of the lens body 110 and the side surfaces 112 of the lens body 110.

In the example shown in FIG. 8E, the optically transparent coating 310 completely or partially covers the back surface 113, 114 the lens body 110, and also the side surfaces 112 of the lens body 110.

In the examples above shown in FIGS. 8A-E, the optically transparent coating 310 is preferred to be arranged on any two mutually adjacent surfaces 111, 112, 113, 114 of the lens body 110.

As already explained before, the refractive index (refraction index or index of refraction) is known to be a dimensionless value that corresponds to the measure of bending of a light ray when passing through different media, that is, a measure of how much a path of light is bent, or refracted, when entering a material. For example, a refractive index of 1.333 for water entails that light travels 1.333 times slower in water than in a vacuum. Increasing the refractive index corresponds to decreasing the speed of light in the material.

On the other hand, reflectance is also known in the field of optics to be the change in direction of an electromagnetic wavefront at an interface between two different media so that the wavefront returns into the medium from which it originated. Generally, it is accepted that optical materials such as glass may have an approximate reflectance of 4% per interface. Hence, an optical material with two interfaces may have a reflectance of around 8%.

The above-described layout of the layered configuration of the optically transparent coating 310 is critically important for a good compromise between the greatest optical transparency for enhanced image acquisition and optimum electrical conductivity for lens heating. The above configuration allows high power to be supplied enough to heat up the lens quickly such as within 8-10 seconds to melt ice adhered to the lens, for example, but not too high (e.g., below 60° C.) in order not to compromise safety for avoid- Table 1 below shows eight different examples corresponding to different layer thicknesses for the different layers 321, 322, 330, 340 of the optically transparent coating 310 in a case where an additional optically transparent front layer 340 is provided on the transparent conductive AZO layer 330. The optically transparent front layer 340 is a low-refractive index silica layer and is formed of silica, $SiO_2$, with a refractive index of below 1.65.

The refractive index of the front layer 340 is preferably below 1.65, more preferably, below 1.60, and still more preferably, between 1.3 and 1.65, and even more preferably, between 1.4 and 1.5. The front layer 340 is directly applied onto the optically transparent conductive layer 330 as shown in FIG. 1.

As shown in Table 1, it is preferred that the low refractive index layer 322 is thicker than the high refractive index layer 321. In particular, the low refractive index layer 322 is at least twice as thick as the high refractive index layer 321. In particular, the low refractive index layer 322 is between 1.2 and 15 times thicker than the high refractive index layer 321. More in particular, the low refractive index layer 322 is between 1.5 and 10 times thicker than the high refractive index layer 321 and still more particular, between 2 and 5 times.

It is preferred that the AZO layer 330 is thicker than the high refractive index layer 321 and the low refractive index layer 322. In particular, it is preferred that the AZO layer 330 is at least twice as thick as the optically transparent back layer 320. For example, the AZO layer 330 may be at least twice as thick as the low refractive index layer 322. In particular, the AZO layer 330 is at least five times thicker than the high refractive index layer 321. In particular, the AZO layer 330 is between 2 and 20 times thicker than the low refractive index layer 322. Specifically, between 2 and 15 times and, further, between 2.5 and 8.5 times thicker than the low refractive index layer 322.

It is preferred that the front layer 340 is thicker than the high refractive index layer 321. In particular, the front layer 340 may be at least twice as thick as the optically transparent back layer 320. Further, the front layer 340 is thicker than the low refractive index layer 322. In particular, the front layer 340 is at least twice as thick as the high refractive index layer 321. More in particular, the front layer 340 is at least three times thicker than the low refractive index layer 322. In particular, the front layer 340 is between 2 and 6 times thicker than the low refractive index layer 322. In particular, between 2 and 5 times and, still more particular, between 2.5 and 4 times thicker than the low refractive index layer 322.

FIGS. 2-7 are graphs showing the normalized reflectance of the lens body 110 with the front and back surfaces 111, 113, 114 coated with the optically transparent coating 310 at different values of wavelength of light. FIGS. 2, 3, 4, 5, 6, and 7 correspond to data from Examples 2, 4, 5, 6, 7, and 8 respectively.

In view of the experimental results shown in Table 1 the following thicknesses for the optically transparent coating 310 are preferred for the visible range of 430 nm-700 nm:

transparent conductive (AZO) layer (330): 50-350 nm;

low-refractive index (SiO$_2$) layer (321): 9-90 nm, preferably, 20-40 nm;

high-refractive index (TiO$_x$) layer (322): 5-15 nm, preferably, 5-10 nm; and low-refractive index (SiO$_2$) layer (340): 9-90 nm, preferably, 20-40 nm.

The combinations of thicknesses of layers 321, 322, 330, 340 shown in table 1 have been shown to provide a good optical performance in terms of low reflectance as can be seen in FIGS. 2-7. FIGS. 2-4 and 7 correspond to examples 2, 4, 5, and 8 where reflectance is below 4% and even below 2% for the most part of the visible electromagnetic spectrum by the human eye. In particular, FIG. 4, corresponding to example 4, shows that for most of the visible spectrum the reflectance is below 1%. On the other hand, FIGS. 5 and 6, corresponding to examples 5 and 7, respectively, show that for the most part of the visible spectrum reflectance is below 2% with the exception of the range between 0.4 and 0.45 nm, where reflectance is between 8% and 2%. For these particular examples and this particular range, it is assumed that such unwanted values of reflectance are due to experimental errors when depositing the coating. Actually, for every configuration, the expected reflectance is below 2% and the small deviation shown in the graphs are experimental in nature.

If the lens body 110 is not coated with the optically transparent coating 310, an unwanted reflection of light may be reflected by a surface of the lens body 110 which may be approximate at 4%. Further, antireflection coatings are well known and are extensively used on the surfaces of optical element e.g., lens elements or covers to reduce unwanted reflection, however, known antireflection coatings do not include any conductive transparent layer 330 such as AZO layer 330. The tradeoff between optical transparency, electrical conductivity and safety cannot be achieved but simply adding an AZO layer to a known antireflection coating. It is desirable that the optically transparent coating 310 of the present disclosure reduces the surface reflectance to a low value over an extended spectral region so as to maintain proper color balance while being highly efficient.

It has to be further considered that this reflectance spectrum has been obtained when all the lens surfaces 111, 112, 113, 114 and, in particular, the front and back surfaces 111, 113, 114 have been coated with the optically transparent coating 310.

The above values ensure a reflectance of the lens body with the optically transparent coating 310 below 0.08 as shown in graphs in FIGS. 2-7. These values provide a good indication for the above-mentioned compromise between the greatest optical transparency and optimum electrical conductivity for the optically transparent coating 310 once arranged on the lens body 110. When designing a particular coating of the present invention with the above-mentioned four layers, it is to be taken into account that it has eight degrees of freedom (four thicknesses and four refractive indices) so there may be different options within the same general inventive concept. It has been found that thinner layers behave better with wavelength (their reflection varies less) but for the AZO layer 330, for example, a greater thickness is needed to have good electrical conductivity so as to achieve the desired power density. Furthermore, the more extreme the refractive indices (higher the high or lower the low), the smaller thicknesses may be used, as in the case of TiOx compared to what happens with SiO$_2$.

The camera module 200 further includes a barrel housing or lens assembly holder 210. The barrel housing 210 is configured for at least partially receiving the lens body 110 and be secured therein through an adhesive such as glue as it will described further below.

An electric current is supplied to the optically transparent coating 310 via a power supply 400 through conductors 450 as shown in FIGS. 10A-C, 11A-C and 12 of the drawings. In these examples shown in the drawings, the power supply 400 is part of or is connected to the above-mentioned electronics carrier that includes a printed circuit board (PCB) 460 that is provided inside the barrel housing 210. In the example shown in FIGS. 10B and 11A, the power supply 400 is provided outside the barrel housing 210, such as in a Camera Monitoring System Electronic Control Unit (CMS ECU), or behind a CMS display, in a vehicle digital rearview mirror system. In that case, the power supply comes from the ECU directly to the heating element 300 or through a camera cable or power over coaxial (PoC) for simultaneous transmission of power and high-resolution analog-video signal and OSD control signal over a single coaxial cable.

In the example disclosed herein, the power supply 400 supplies 12 V. As a result, a rapid increase in temperature in the lens body 110 from −10° C. to 0° C. by the Joule effect in 8-10 s is obtained. For this purpose, the optically transparent coating 310 has an electrical resistance of 100-1500 ohms with a power density of 200-3000 W/m$^2$, in particular, 250-2000 W/m$^2$, presenting a good tradeoff between a fast-heating process and safety.

Conductors are copper cables 450 in the examples shown for feeding an electrical current to the optically transparent coating 310 for proper resistive heating of the lens body 110 for removing any water-based obstructions that may be attached thereto. Conductors 450 are attached to the optically transparent coating 310 and electrically connected to the optically transparent conductive layer 330 by suitable attaching mechanism such as glue as stated above. Attaching mechanism in fluid form before curing are preferred as good attachment and electrical contact to conductors 450 in the heating element 300 is ensured. Transparent glue is most preferred for cases when applied where the optical axis O is arranged. One example of preferred attaching mechanism is one having a substrate made of epoxy and electrically conductive particles such as silver particles.

Figure 11A:
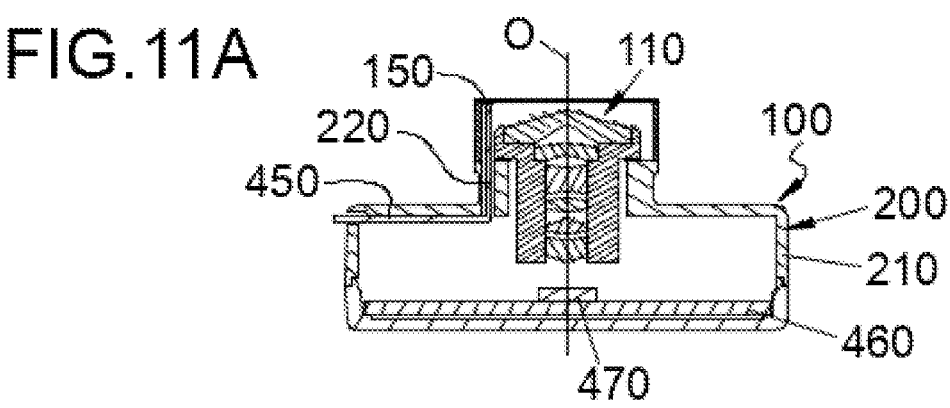
FIG. 11A shows a camera module with a protective cover.
Figure 11B:
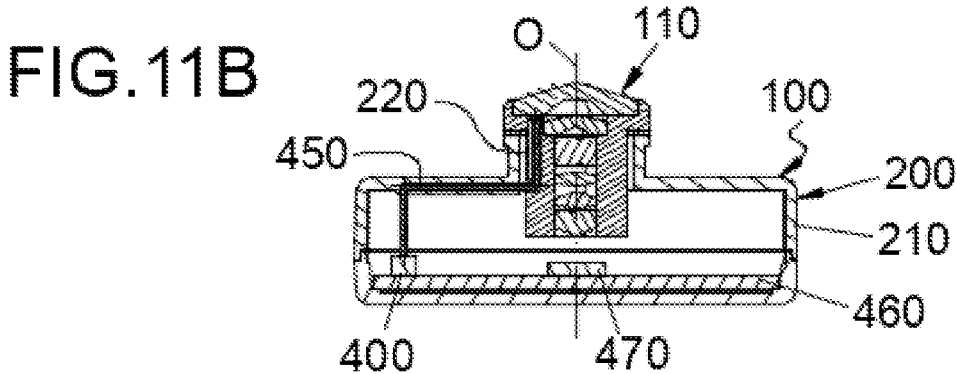
FIG. 11B shows a camera module without protective cover.
Figure 12:
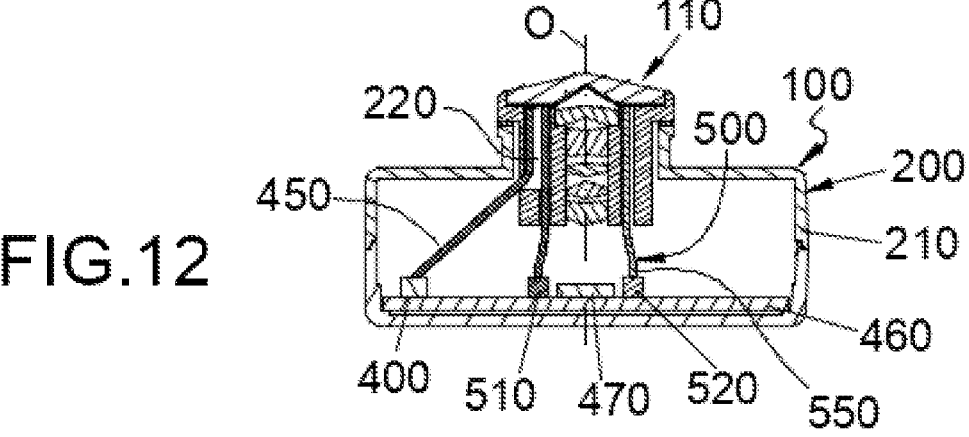
FIG. 12 illustrates a camera module comprising a speckles detection system and a heating device.

As shown in FIGS. 11A-B and 12, the lens barrel 119 of the lens assembly 100 includes the above-mentioned passageway 220 for the conductors 450 to pass through. The passageway 220 extends within the lens barrel 119 so that a first end of the conductors 450 can be electrically connected to the power supply 400 and a second end of the conductor 450 can be electrically connected to the optically transparent conductive layer 330.

In the example of FIG. 10A, the passageway is arranged extending through the lens barrel 119 in the lens assembly 100. In the example of FIG. 10B, the passageway is arranged extending from the outside of the front housing of the camera module 200. In the example of FIG. 10C, the passageway is arranged extending through a lateral side of the lens assembly 100.

The arrangement of the passageway 220 within the lens barrel 119 shown in FIGS. 10A-C or alternatively within the barrel housing 210 shown in FIGS. 11A-B is advantageous in that light coming from the outside of the lens body 110 is properly guided through the different lens elements until reaching the image sensor 470 where it is converted into a signal that will form an image to be displayed on a screen. As a result of the arrangement of the passageway 220, light beams do not hit the conductors 450 such that no interference exists with the light beams and thus with the captured image.

As shown in FIGS. 11A-B, the passageway 220 in the barrel housing 210 of the camera module 200 for the conductor 450 to pass through extends within the barrel housing 210 towards the lens body 110 so that a first end of the conductors 450 can be electrically connected to the power supply 400 and a second end of the conductors 450 can be electrically connected to the optically transparent conductive layer 330.

One end of the passageway 220 leads to an inner space defined by the inner walls of the barrel housing 210. An opposite end of the passageway 220 may be arranged in the inner space and optionally near the power supply 400.

The camera module 200 may comprise an exterior optical element and one or more interior optical elements. The lens body 110 may be part of at least one of the exterior and interior optical elements.

There may be a space formed between the exterior optical element and the one or more interior optical elements. The exterior optical element may be a protective external cover 150 shown in FIG. 11A. The protective external cover 150 may be made for example of plastic or glass arranged in the lens assembly 100 configured to protect the lens body 110 against external elements such as dust, water, etc. In some other examples, the exterior optical element may be an internal glass or plastic optical element forming part of the camera, e.g., the cover 150 of the lens barrel 119 or a lens itself. In any case, such exterior optical element may become dirty due to e.g., dust accumulation, mud splashes, malicious paintings, etc. As a result, image areas covered by contamination do not provide appropriate image data.

The lens barrel 119 is configured and sized to position and align optical lens elements 110a, 110b, 110c, 110d, 110e, 110f of the lens assembly 100. For example, the lens barrel 119 may include mounting features sized and configured to engage with and position a plurality of internal optical system elements such as one or more fixed lens elements, shutter system elements, covers and the like. In this example, the interior optical element e.g., a lens and the external optical element of the camera module 200 may be fixed (directly or indirectly) to the barrel housing 210. The internal lens elements may be spaced apart a predetermined distance with respect to the exterior optical element.

The exterior optical element e.g., the above-mentioned cover 150 and/or the first lens element 110a may be substantially circular-shaped although some other shapes may be possible. The exterior optical element may be coupled to the inner surface of the barrel housing 210 at or near its distal end, thus, in use, the exterior optical element closes off the top of the barrel housing 210. The cover 150 may have for example a threaded coupling with the top of the barrel housing 210. The barrel housing 210 may be single piece or it may comprise a number or parts.

The internal optical element, for example, the lens body 110, may be spaced apart a predetermined distance with respect to the exterior optical element, for example, the cover 150. In examples where the exterior optical element is the first lens element 110a and the interior optical element is a further lens, for example, the second lens element 110b, the distance between the exterior optical element and the interior optical element may be less than 1.5 mm. However, in examples where the exterior optical element is a cover 150, the distance may be e.g., between 1 cm and 2 cm with respect to the interior optical element.

In FIG. 11A, the barrel housing 210 extends above the lens assembly 100 and is provided with the above-mentioned cover 150 also referred herein to as optical element. In this example, the exterior optical element is the cover 150 and the lens assembly 100 is the interior optical element.

The exterior or the interior optical element is an optically transparent component through which the optical axis O extends.

When no cover 150 is provided, the exterior optical element is the first lens element 110a and the other lens elements 110b-f are interior optical elements.

When a cover 150 is provided, as in the example shown in FIG. 11A, the power supply 400 is outside the barrel housing 210 of the camera module 200 such as in the ECU of a digital rear-view mirror due to higher energy demands.

Specifically, FIGS. 11A-B of the drawings show the conductors 450 running through the passageway 220 which extends through the barrel housing 210. Specifically, FIG. 11A shows the camera module 200 having said cover 150 or exterior optical surface with the optically transparent coating 310 applied thereto. Thus, in the example of FIG. 11A the lens body 110 has no optically transparent coating 310. In the examples of FIGS. 11B and 12 the camera module 200 is not provided with a cover 150 so the lens body 110 has the optically transparent coating 310. Several examples of locations of the lens body 110 on which the optically transparent coating 310 may be applied are shown in FIGS. 8A-E as described above.

The conductors 450 each has a first end connected to the power supply 400 and a second end connected to the optically transparent coating 310. The optically transparent coating 310 is arranged between the external optical element, for example, the cover 150, and the interior optical element, for example the lens body 110. Thus, the second end of the conductors 450 are arranged between the external optical element and the internal optical element. When no cover 150 is provided, the optically transparent coating 310 and the second end of the conductors 450 are also between at least one portion of the external optical element and at least one portion of the internal optical element.

When dirtiness in the exterior optical element is excessive or an ice sheet is present thereon, the camera module 200 may produce images of insufficient quality. Therefore, it may be of interest to determine when the exterior optical element becomes excessively dirty in order to undertake corresponding corrective action(s), such as e.g., activation of an automatic cleaning system, triggering of an alarm for manual cleaning, etc.

For this purpose, a speckles detection system 500 as disclosed in US20190391075 is provided in the camera module 200 shown in the example of FIG. 12. The speckles detection system 500 comprises one or more light sources 510 configured to emit light towards the exterior optical element, such as the lens body 110 of the cover 150. Said exterior optical element then reflects light from said light sources 510, 520 when speckles are located on the exterior surface of the exterior optical element. Light receivers 520 are provided to receive light reflected by the lens body 110 or the cover 150 such that speckles on the exterior surface of the exterior optical element (e.g., lens body 110) are detected. The light receivers 520 may comprise a broadband detectors including infrared detectors configure to operate over 700 nm. Further, the one or more light sources may generate a predetermined emission wavelength centered on absorption bands of atmosphere, for example, at wavelengths at or near 780 nm, 940 nm, 1130 nm, 1400 nm, and 1900 nm.

The speckles detection system 500 includes optical fibers 550 connected to the electronics carrier, in particular, to the printed circuit board 460. One optical fiber 550 is located at or near light emitter 510 and other optical fiber 550 is located at or near light receiver 520. One end an optical fiber 550 is located between the exterior optical element and the interior optical element. Reflected light beam from the exterior surface of the exterior optical element is received via the optical fibers 550 towards the light receiver 520.

More in particular, one end of an optical fiber 550 is located between the first lens element 110a and the second lens element 100b, being the first lens element 110a the outermost lens element comprising the exterior surface, and the second lens element 110b may be arranged underneath the first lens element 110a. Further, the other end of the optical fiber 550 is located in a different location of the other optical fiber 550 but still between the first lens element 110a and the second lens element 110b.

As shown in FIG. 12 of the drawings, at least one portion of the passageway 220 may extend through the lens assembly 100 such as through the lens barrel 119, or at least one portion of the passageway 220 may extend through the barrel housing 210. In any case, the passageway 220 is configured to or adapted for receiving at least one optical fiber 550 of the speckles detection system 500 and also at least one conductor 450 of the heating element.

When an optical interference is detected in the lens assembly 100 of the camera module 200, non-visible light to the human eye, for example, infrared light is projected by light emitters 510 onto the external optical element such as the cover 150, if provided, or the first lens element 110a. Light bounced by reflection, due to optical interference resulting e.g., from speckles on the outer surface of the exterior optical element is received causing a heating instruction to be sent by a controller when received light exceeds a threshold. As a result of the heating instruction, electrical power is then fed by power supply 400 through conductors 450 into the optically transparent coating 310 that is arranged on at least one surface of the exterior optical element. This results in efficient cleaning off the optical interference that was present in the exterior optical element.

With the above-mentioned speckles detection system 500 in combination with the present lens assembly 100, an exterior optical element in the camera module 200 can be efficiently cleaned.

A further particular example of the camera module 200 will be described below.

The camera module 200 comprises a lens assembly 100 including a lens body 110 and a heating element 300. The heating element 300 includes the above described optically transparent coating 310 that comprises an optically transparent conductive layer 330. The optically transparent coating 310 is applied to at least one portion of the lens body 110 for resistive heating of said at least one portion of the lens body 110 as electric current flows through the optically transparent conductive layer 330 for removing any water-based obstructions that may be attached to the lens body 110.

In this further example, the optically transparent conductive layer 330 may comprise at least an aluminium-doped zinc oxide layer. The optically transparent coating 310 further comprises at least one optically transparent back layer 320 arranged between the lens body 110 and the optically transparent conductive layer 330 and at least one electrically conductive front layer 340. The optically transparent back layer 320 comprises at least one high-refractive index layer 321 having a refractive index of above 1.65 and at least one low-refractive index layer 322 having a refractive index of below 1.65, wherein the high-refractive index layer 321 comprises a metal oxide, preferably a metal oxide with low or none electrical conductivity such as titanium oxide ($TiO_x$), and the low-refractive index layer 322 comprises an optically transparent dielectric material such as silica ($SiO_2$). The optically transparent coating 310 further comprises at least one optically transparent front layer 340 arranged on the optically transparent conductive layer 330, wherein the at least one optically transparent front layer 340 has a refractive index of below 1.65.

In this example, the high-refractive index layer 321 is 2-60 nm thick, the low-refractive index layer 322 may be 5-200 nm thick, and the optically transparent front layer 340 is 5-600 nm thick. More optionally, the optically transparent conductive layer 330 is 10-1000 nm thick.

In this example, it is preferred that the optically transparent coating 310 has a power density of 200-3000 W/m$^2$ so as to heat up the lens body 110 within seven minutes to melt ice at $-18°$ C. adhered to front surface of an optical element such as the lens body 110, preferably, within 8-10 seconds when ice is at $-10°$ C. Further, for safety reasons, the optically transparent coating 310 does not exceed 60° C. Further, once the optically transparent coating 310 is applied to the optical element such as the lens body 110, the normalized reflectance is below 0.03, preferably, below 0.02 in the visible electromagnetic spectrum by the human eye. That is, the optical element such as the lens body 110 has reduced the reflectance at least four times once the optically transparent coating 310 has been applied. It may be also preferred that the optically transparent conductive layer 330 comprises at least an aluminium-doped zinc oxide layer having a thickness of 20-600 nm. The optically transparent coating 310 may further comprise at least one optically transparent back layer 320 arranged between the lens body 110 and the optically transparent conductive layer 330, and at least one electrically conductive front layer 340 arranged on the aluminium-doped zinc oxide (AZO) layer. The AZO layer 330 may be at least twice as thick as the optically transparent back layer 320. Further, the front layer 340 may be at least twice as thick as the optically transparent back layer 320.

The lens body 110 in this case may comprises a plurality of lens elements 110a, 110b, 110c, 110d, 110e, 110f including a first lens element 110a that comprises a front surface 111, a back surface 113, 114, and a side surface 112. The front surface 111 of the first lens element 110a is an outer surface that, in use, may be at least partially surrounded by the exterior environment of the camera module 200. This is, when lens assembly 100 is attached to the camera module 200, the outer surface of the first lens element 110a may be the surface of the lens assembly 100 that is furthest from the image sensor 470. The back surface 113, 114 comprises a first part 113 which is substantially perpendicular to the optical axis O and a second part 114 which is a curved part. The side surface 112 abuts the front surface 111 and the back surface 113, 114. The optically transparent coating 310 is applied to at least one portion of one or more of the front surface 111, the side surface 112, and the back surface 113,114. In particular, the optically transparent coating 310 is arranged on two surfaces of the lens body 110, and more preferably the optically transparent coating 310 is arranged on two mutually adjacent surfaces of the lens body 110. More preferably, the optically transparent coating 310 is arranged both on at least one portion of the surface of the lens body 110 where the lens optical axis O passes through and on at least one portion of the surface of the lens body 110 where the lens optical axis O does not pass there through. For example, the optically transparent coating 310 may be applied to at least one of:

(i) a portion of the front surface 111 and a portion of the side surface 112 of the lens elements 110a, 110b, 110c, 110d, 110e, 110f of the lens body 110; or (ii) a portion of the first part (113) of the back surface and a portion of the second part (114) of the back surface.

The heating element 300 may further comprise in this example a conductor 450, preferably at least two conductors 450, for electrically connecting the above mentioned power supply 400 to the transparent conductive layer 330 for feeding electrical current thereto. Conductors 450 are part of the heating element 300 and are arranged extending within the barrel housing 210 towards the lens body 110.

In this particular example of the present camera module 200, the attaching mechanism for the conductors 450 to the optically transparent coating 310 are provided for by electrically connecting the conductor 450 to the optically transparent conductive layer 330. The attaching mechanism may be arranged on any surface of the lens body 110 which the optical axis O does not pass through, particularly, on the first part 113 of the back surface and/or the lateral surface 112. More optionally, the attaching mechanism are an electrically conductive adhesive. The optically transparent coating 310 is arranged on two mutually adjacent surfaces of the lens body 110 and the attaching mechanism are arranged on one the two mutually adjacent surfaces of the lens body 110 where the optical axis O does not pass there through.

Still in a further particular example, the camera module 200 comprises an optically transparent exterior optical element, an optically transparent interior optical element, a camera module housing, an electronics carrier 460, a heating element 300, and a lens assembly 100 that includes a lens body 110 that may be part of at least one of said exterior and interior optical elements.

The heating element 300 includes an optically transparent coating 310 that comprises a optically transparent conductive layer 330. The optically transparent coating 310 is applied to at least one portion of the exterior optical element for resistive heating of the at least one portion of the optical element as electric current flows through the optically transparent conductive layer 330 resulting in removal of any water-based obstructions that may be attached to the exterior optical element. At least one conductor 450 is provided for the supply of an electric current to the optically transparent conductive layer 330 for feeding electrical current thereto.

The camera module 200 may include a protective external cover 150 for covering and protecting the lens assembly 100. The cover 150 may be made of plastics, glass, or any other suitable material. If the camera module 200 includes the cover 150, that cover 150 corresponds to the exterior optical element and the lens body 110 corresponds to said interior optical element. If the camera module 200 does not include a cover, the first lens element 110a of the lens body 110 corresponds to the exterior optical element and the second lens element 110b of the lens body 110 corresponds to the interior optical element.

Thus, the exterior optical element may be at least one of the protective external cover 150 and the lens assembly 100, being spaced apart a predetermined distance with respect to the interior optical element.

The camera module housing further comprises a barrel housing 210 configured for at least partially receiving the exterior optical element and the interior optical element. The power supply 400 is located in at least one of:

(i) inside the camera module housing, particularly on the electronics carrier such as the printed circuit board 460; and (ii) outside the camera module housing, particularly underneath a display which provides a displayed image based on a captured image taken by the camera module 200. The display may be part of a digital mirror system such as a lateral digital mirror system.

In any case, the power supply 400 is configured to supply electric current to the optically transparent conductive layer 330. The electronics carrier 460 comprises an image sensor 470 which is optically aligned with the lens assembly 100. The camera module housing may comprise at least one passageway 220 for the passage of the conductor 450. Preferably, the at least one passageway 220 extends through the barrel housing 210.

A process for applying the optically transparent coating 310 to an exterior optical element, being the exterior optical element a protective cover 150 or a lens body 110, comprises the following steps:

a) depositing a solution onto the exterior optical element, the solution comprising a salt;

b) evaporating the solution at a temperature sufficient to leave a residue of the salt;

c) heating the residue at a predetermined temperature for a time period sufficient to convert the deposit into a layer of a predetermined thickness;

d) repeating steps a-c so as to obtain:

(i) at least one high-refractive index layer 321 comprising a metal oxide with low or none electrical conductivity having a refractive index of above 1.65 and a thickness of between 2-60 nm, (ii) at least one low-refractive index layer 322 comprising an optically transparent dielectric material having a refractive index of below 1.65 and a thickness of between 5-200 nm, (iii) an optically transparent conductive layer 330 comprising an optically transparent conductive material having a refractive index of above 1.65 and a thickness of between 10-900 nm, and (iv) at least one optically transparent front layer 340 comprising an optically transparent dielectric material having a refractive index of below 1.65 and a thickness of between 5-600 nm.

The optically transparent coating 310 has an electrical resistance of 100-1500 ohms with a power density of 200-3000 W/m$^2$ and the exterior optical element is applied with the optically transparent coating 310 has a normalized reflectance of below 0.03 for the visible electromagnetic spectrum by the human eye. Furthermore, the optically transparent conductive layer 330 is deposited with a size greater than the other layers 321, 322, 340, in such a way that a portion of the optically transparent conductive layer 330 is uncovered, in use, it is adapted to receive one end of the conductor and apply the attaching mechanism (adhesive) to guarantee the mechanical bonding and electrical connection.

The process for applying the optically transparent coating 310 may further comprise:

e) applying the attaching mechanism such that a conductor is attached to the optically transparent coating 310 and electrically connected to the optically transparent conductive layer 330.

Preferably, the attaching mechanism is a fluid electrically conductive adhesive which may be optically transparent and wherein a first end of the conductor is attached to the uncovered portion of the optically transparent conductive layer 330.

The process for applying the optically transparent coating 310 may further comprise:

f) curing the attaching mechanism by applying a predetermined air, light or temperature such that a first pre-curing state is liquid before curing, and then the adhesive is in a second curing state which is no longer liquid once curing has been applied.

For making the lens assembly 100, the optically transparent coating 310, is applied to at least one portion of one or more of front, side, rear, and back surfaces 111, 112, 113, 114 of the lens body 110. The optically transparent coating 310 comprises the above mentioned high-refractive index titanium oxide ($TiO_x$) layer 321 that is applied to one or more of the portions 111, 112, 113, 114 of the lens body 110, a low-refractive index silica ($SiO_2$) layer 322 that is then applied to the high-refractive index indium tin oxide ($TiO_x$) layer 321, and the transparent conductive aluminium-doped zinc oxide (AZO) layer 330 that is applied to the low-refractive index silica ($SiO_2$) layer 321. More in particular, a front layer 340 which is a low-refractive index silica ($SiO_2$) layer is arranged on the transparent conductive aluminium-doped zinc oxide (AZO) layer 330.

For assembling the camera module 200 to the lens assembly 100, the lens body 110 having the optically transparent coating already applied thereon, is at least partially inserted into the barrel housing 210. Afterwards, the lens body 110 is accurately moved, for example, by a 5-axis robot into correct alignment with the image sensor 470. In that way, the image sensor 470 is then coupled to the PCB 460 with a suitable optical communication and in alignment with the lens assembly 100 such that an image exterior of the vehicle is properly captured.

Examples of the present camera module 200 having a lens assembly 100 and a method for making the lens assembly 100 have been disclosed herein. However, other alternatives, modifications, uses and/or equivalents thereof are possible. For example, unless otherwise stated, application of the transparent conductive coating 310 to the lens body 110 may involve direct application of the transparent conductive coating 310 to the lens body 110 but also in some cases it may involve indirect application of the transparent conductive coating 310 to the lens body 110. The latter may occur when an intermediate layer is present in the lens body 110, for example, when a cover glass is provided onto the lens body 110 with the transparent conductive coating 310 being applied in this case to the cover glass and thus not directly to the lens body 110.

The scope of the present disclosure should not be limited by the particular examples disclosed herein but should be determined only by a fair reading of the claims that follow. Reference signs related to drawings placed in parentheses in a claim are solely for attempting to increase the intelligibility of the claim and shall not be construed as limiting the scope thereof.

What is claimed is:

1. A lens assembly comprising:
a lens body including at least one lens element; and
a heating element including an optically transparent coating that comprises an optically transparent conductive layer having at least aluminum-doped zinc oxide, wherein the optically transparent coating is applied to at least a portion of the lens body such that the at least aluminum-doped zinc oxide is coupled to the at least one lens element for resistive heating of at least one portion of the lens body as electric current flows through the optically transparent conductive layer for removing any water-based obstructions that may be attached to the lens body,
wherein the optically transparent coating further comprises at least one optically transparent back layer arranged between the lens body and the optically transparent conductive layer.

2. The lens assembly of claim 1, wherein, in use, the lens body is intended to be in optical communication with an image sensor such that light passes through the at least aluminum-doped zinc oxide of the optically transparent conductive layer to reach the image sensor.

3. The lens assembly of claim 1, wherein the optically transparent coating has an electrical resistance of 100-1500 ohms being supplied with 6-36 Volts (V), preferably with a power density of 200-3000 W/m$^2$.

4. The lens assembly of claim 1, wherein the optically transparent back layer comprises at least one high-refractive index layer having a refractive index above 1.65 and at least one low-refractive index layer having a refractive index below 1.65, wherein the high-refractive index layer comprises a metal oxide, preferably a titanium oxide, and wherein the at least one low-refractive index layer comprises silica.

5. The lens assembly of claim 4, wherein the optically transparent coating further comprises at least one optically transparent front layer arranged on the optically transparent conductive layer, wherein the optically transparent coating has a refractive index below 1.65.

6. The lens assembly of claim 5, wherein the at least one high-refractive index layer is 5-30 nm thick, wherein the at least one low-refractive index layer is 9-90 nm thick, and wherein the optically transparent front layer is 10-200 nm thick.

7. The lens assembly of claim 1, wherein the lens body comprises a plurality of lens elements including the at least one lens element that comprises a front surface, a back surface, and a side surface, wherein the front surface is arranged facing the back surface, the back surface comprising a first part which is substantially perpendicular to an optical axis (O) of the lens body and a second part which is a curved part, wherein the side surface abuts the front surface and the back surface, and wherein the optically transparent coating is applied to at least one portion of one or more of the front surface, the side surface, and the back surface.

8. The lens assembly of claim 7, wherein the optically transparent coating is applied to at least one of:
(i) a portion of the front surface and a portion of the side surface; or
(ii) a portion of the first part of the back surface and a portion of the second part of the back surface.

9. The lens assembly of claim 8 further comprising conductors to supply of electric current to the optically transparent conductive layer for resistive heating of at least one portion the lens body.

10. The lens assembly of claim 9, wherein further comprising an attaching mechanism for attaching the conductors to the optically transparent coating such that the conductors are electrically connected to the optically transparent conductive layer.

11. The lens assembly of claim 10, wherein the attaching mechanism is arranged on at least one of the first part of the back surface or a lateral surface.

12. A camera module for motor vehicles including the lens assembly of claim 1, the camera module comprising an optically transparent exterior optical element, an optically transparent interior optical element, and the lens assembly, the camera module further including:

conductors to supply electric current to the optically transparent conductive layer for feeding electrical current to the optically transparent conductive layer;

a camera module housing comprising a barrel housing configured for at least partially receiving the lens body and wherein the camera module housing comprises at least one passageway for the passage of the conductors, and an image sensor, wherein the lens body is in optical communication with the image sensor such that light passes through the at least aluminum-doped zinc oxide of the optically transparent conductive layer to reach the image sensor.

13. The camera module of claim 12, wherein the at least one passageway is arranged extending within the barrel housing towards the lens body.

14. The camera module of claim 12, wherein the optically transparent coating has an electrical resistance of 100-1500 ohms with a power density of 200-3000 W/m$^2$.

15. The camera module of claim 12, wherein the lens body comprises a plurality of lens elements including the at least one lens element that comprises a front surface, a back surface, and a side surface, wherein the front surface is arranged facing the back surface, the back surface comprising a first part which is substantially perpendicular to an optical axis (O) of the lens body and a second part which is a curved part, wherein the side surface abuts the front surface and the back surface, and wherein the optically transparent coating is applied to at least one portion of one or more of the front surface, the side surface, and the back surface.

16. A method for producing the lens assembly of claim 1, the method comprises:

providing the lens body including the least one lens element;

applying at least one high-refractive index layer onto one or more of a front surface, a back surface, and a side surface of the lens body such that the at least one high-refractive index layer is coupled to the at least one lens element;

applying at least one low-refractive index layer onto the high-refractive index layer; and providing the heating element including the optically transparent coating that comprises the optically transparent conductive layer having the at least an aluminum-doped zinc oxide layer that includes:

applying the at least one aluminum-doped zinc oxide layer onto the low-refractive index layer such that the at least one aluminum-doped zinc oxide layer of the optically transparent coating is coupled to the at least one lens element, wherein in use, the at least one aluminum-doped zinc oxide layer is adapted for resistive heating of at least one portion of the lens body as electric current flows through the at least one aluminum-doped zinc oxide layer for removing the water-based obstructions that may be attached to the lens body.

17. The lens assembly of claim 1, wherein the optically transparent coating further comprises at least one optically transparent back layer arranged between the lens body and the at least aluminum-doped zinc oxide of the optically transparent conductive layer.

18. A method for providing the lens assembly of claim 1, the method comprising:

providing the lens body including the at least one lens element; and providing the heating element including the optically transparent coating that comprises the optically transparent conductive layer having the at least one aluminum-doped zinc oxide layer, that includes applying the at least one aluminum-doped zinc oxide layer onto the lens body such that the at least one aluminum-doped zinc oxide layer of the optically transparent coating is coupled to the at least one lens element, and wherein, in use, the at least one aluminum-doped zinc oxide layer is adapted for the resistive heating of the at least one portion of the lens body as the electric current flows through the optically transparent conductive layer for removing any water-based obstructions that may be attached to the lens body, wherein the optically transparent conductive layer comprises at least aluminum-doped zinc oxide having a thickness of 80-1000 nm.

19. The camera module of claim 1, wherein the at least aluminum-doped zinc oxide of the optically transparent conductive layer has a thickness of 80-1000 nm.

* * * * *